US005546055A

United States Patent [19]
Klughart

[11] Patent Number: 5,546,055
[45] Date of Patent: Aug. 13, 1996

[54] CRYSTAL OSCILLATOR BIAS STABILIZER

[75] Inventor: Kevin M. Klughart, Addison, Tex.

[73] Assignee: Dallas Semiconductor Corp., Dallas, Tex.

[21] Appl. No.: 518,906

[22] Filed: Aug. 24, 1995

[51] Int. Cl.[6] .................................................. H03B 5/36
[52] U.S. Cl. .............................. 331/116 FE; 331/158; 331/175; 331/185
[58] Field of Search ..................... 331/57, 74, 116 R, 331/116 FE, 117 R, 117 FE, 158, 175, 185

[56] References Cited

U.S. PATENT DOCUMENTS 5,025,230  6/1991  Kondo et al. ................. 331/116 FE

OTHER PUBLICATIONS

Robert J. Matthys, *Crystal Oscillator Circuits*, pp. 42–45 John Wiley & Sons, 1983.
Robert J. Matthys, *Crystal Oscillator Circuits*, pp. 159–196 John Wiley & Sons, 1983.

Primary Examiner—David Mis
Attorney, Agent, or Firm—Jenkens & Gilchrist

[57] ABSTRACT

A dynamic bias stabilization device providing significant control of the operating point and frequency stability of a low-power crystal oscillator includes an inverting CMOS amplifier as its primary gain element and a filtered resistive current source to supply the inverting amplifier with operating power. A number of MOS transmission gates and integrated capacitors configured in a T-type network are used as the amplifier feedback element. The control voltages for these feedback transmission gates are derived from the current source which also supplies power to the crystal oscillator amplifier.

24 Claims, 8 Drawing Sheets

CRYSTAL OSCILLATOR BIAS STABILIZER

FIELD OF THE INVENTION

This invention relates generally to the field of low power crystal oscillators, and in particular, to systems and devices for stabilizing the bias point of an inverting oscillator amplifier in a low power crystal oscillator.

BACKGROUND OF THE INVENTION

There is a wide commercial market available for the use of electronic real time clocks which maintain the current date and time while powered by batteries. One significant feature requirement of this market is very low battery power consumption by the crystal oscillator used to generate the time base for the real time clock circuitry. One technique used in current devices is a CMOS inverting amplifier operating in the weak inversion regime of MOSFET transistors.

CMOS crystal oscillators which use inverting amplifier configurations require some form of negative DC feedback in order to maintain a stable DC operating point for the oscillator amplifier to function properly.

In particular, these crystal oscillator configurations require both a P-channel (PCH) and an N-channel (NCH) MOS devices configured for complementary amplification, VCC power and GND ground connections, a crystal resonator (typically an external component to the amplifier circuitry), two crystal load capacitors (to trim the crystal resonant frequency), a feedback resistor to provide negative gain feedback for the amplifier, a current limiting resistor to limit the power dissipation of the crystal, and a complementary MOS amplifier to buffer the output of the crystal oscillator amplifier (See FIG. 1).

Current crystal oscillators often limit the voltage amplitude across the crystal to approximately 1.5 V, with internal supply voltages for the crystal oscillator being set to approximately 1.7 V–2.0 V.

Many current crystal oscillators use an integrated resistor as the feedback resistance for the inverting CMOS amplifier mentioned above. Occasionally, a CMOS transmission gate operating in the linear region is used to simulate a resistor for the required feedback resistance. In this mode the resistance of the CMOS transmission gate can be considered constant to a first order approximation, as the gate-source voltage is above the threshold voltage of approximately 0.8 V–1.2 V for either the P-channel or the N-channel device.

A T-type resistor/capacitor combination can also be used to implement the feedback network, the advantage of this approach being the reduction of negative feedback at the operating frequency of the crystal oscillator, while at the same time providing significant negative feedback at DC to ensure a stable input bias point to the CMOS amplifier.

A problem with current crystal oscillators can be observed when either noise or DC leakage causes the input to the inverting oscillator amplifier to drift from its nominal DC bias point. The source of this noise or DC leakage can be either capacitive coupling or poor printed circuit board cleaning which may leave minute conductive residue between the amplifier input node and some other portion of the oscillator circuitry.

As a result of this leakage path, currents on the order of 5–50 nA may be injected or extracted from either the input or the output of the oscillator amplifier, resulting in a change in the bias point of the oscillator amplifier. As the bias point shifts, the gain and frequency stability of the crystal oscillator system suffer significantly.

Eventually, with a significantly high leakage path, the overall loop gain of the amplifier falls below unity and oscillation ceases. This leakage threshold is termed the "input leakage sensitivity" and the "output leakage sensitivity" for the oscillator amplifier input and output respectively, and is usually expressed as a positive/negative pair of numbers which represent the amount of current that can be sinked by the oscillator pin as well as sourced by the same pin.

As discussed above, current crystal oscillator implementations suffer in that they have very low leakage sensitivity values, typically in the range of 2–10 nA on an oscillator running on a 3 V battery using approximately 300 nA current.

The use of lower resistive feedback could be used to improve the leakage sensitivity; however, this reduces the overall oscillator amplifier gain at the target frequency of the system. As a general rule, greater negative feedback reduces the overall system gain and simultaneously increases the bias point stability.

While T-type resistive/capacitor filter networks have been used in discrete oscillator amplifiers, they suffer from loading and device sizing problems when implemented in integrated form. This is due to the large area required for large value resistors and the large capacitance present in large value resistors when integrated on a silicon substrate.

A significant aspect of the leakage sensitivity present within current designs is due in part to changes in packaging technology. Within the past decade, there has been a significant migration from 100-mil centered thru-hole dual in-line (DIP) packages to surface mount technologies.

This migration to surface mount technology has in general significantly reduced the inter-pin spacing dimensions on a given device package configuration. For example, in 1985 a standard real time clock comprised a 100-mil spaced, 16-pin DIP package mounted on a circuit board with a 32768 Hz crystal mounted beside the package. Ten years later, the same configuration would have the real time clock packaged in a 16-pin SOIC or TSSOP with inter-pin spacings of 50-mils or 25-mils.

Given similar printed circuit board (PCB) contamination levels, this would result in one-half to one-quarter the inter-pin resistance in the surface mount technology as compared to the previous thru-hole technology.

This reduction in resistance results in a direct linear increase in inter-pin leakage, making the new surface mount technology two to four times more susceptible to leakage than the previous thru-hole technology. This analysis of reduced leakage immunity assumes that the board cleaning technology has remained constant during the move to surface mount technology. This is not the case, however, as the removal of environmentally unfriendly CFC-based PCB cleaning solutions has resulted in the substitution of many PCB cleaning agents which do not perform at the same level as their CFC-based counterparts. This results in more contamination and leakage than would have been expected using a conventional CFC-based cleaning agent.

Especially vulnerable to leakage paths are the new water-based cleaning agents, which can produce humidity-sensitive "spider hair" leakage trails on PCBs which can appear open at low humidity levels and have 100 megohms of impedance or less under high humidity conditions. It is important to remember that 1 gigaohm impedance using the current oscillator technology represents more than 1 nA of leakage current. If this figure is multiplied by four to account for surface mount technology, then the total leakage level is 4 nA. This figure is in many cases more than can be tolerated by the existing oscillator bias stabilization schemes.

Thus, it can be readily seen that with changes in packaging technology and PCB cleaning technology, the same circuit designs which were adequate in the 1985 timeframe can and in fact do fail to address significant design issues present 10 years later.

The techniques using static resistors or transmission gates in their linear or near-linear regions of operation fail to address the desirability of a dynamic feedback resistance characteristic which varies with frequency, operating voltage, and current bias point.

Another problem with current technologies is the frequency deviations of the crystal oscillator which are caused by shifts in bias point of the system. Minute shifts in the operating bias point cause shifts in the resonant frequency of the oscillator due to voltage coefficients associated with the trim capacitors in the oscillator amplifier.

Yet another issue of concern with the current amplifier topologies used in real time clock crystal oscillators is that of noise immunity. Since the CMOS inverting amplifier is running on very low currents (less than 1 uA at 3 V), external noise may be injected into either the input or the output of the CMOS amplifier and impact the oscillation frequency of the crystal oscillator.

Attempts to solve some of these problems have in the past taken the form of the addition of resistive or semi-resistive negative feedback to the CMOS oscillator amplifier. While this approach allows the bias point and noise issues to be addressed, it suffers significantly in the fact that it reduces the closed-loop gain of the oscillator amplifier at the target crystal frequency, which is typically on the order of 32768 Hz.

In conventional amplifiers, it is usually possible to increase the gain of the amplifier by the judicious use of more operating power. However, since one of the primary design goals of battery-powered real time clocks is that of low power consumption, there is a limit to the extent to which this approach may be used to solve the reduction of gain caused by the addition of negative feedback.

What exacerbates the problem in the case of real time clock oscillators operating in the weak inversion regime is the dramatic loss of frequency response when operating at these low current levels. At 32768 Hz, the open loop gain may only be on the order of 5 or 10, meaning that any significant loss of gain due to negative feedback could cause the amplifier gain to be reduced below unity, forcing the oscillator to cease functioning. Since a good margin of closed loop gain is on the order of 4–8, significant use of negative feedback should be viewed with caution in this application.

SUMMARY OF THE INVENTION

The present invention overcomes the shortcomings and deficiencies of the prior art discussed above by providing a crystal oscillator dynamic bias stabilization scheme in which negative feedback is provided at low frequencies and inhibited at higher frequencies, thereby preserving the closed loop gain of a weak inversion CMOS amplifier.

Embodiments of the present invention use a non-linear feedback network created via use of a split transmission gate feedback network operating in the weak inversion regime of MOSFET transistors. This network allows significant negative feedback at low frequencies but significantly reduces negative feedback at the desired operating frequency of the crystal resonator.

Certain embodiments of the present invention also use a current source which limits the operation of the crystal oscillator to weak inversion. This current source may be implemented as filtered resistive ladder network, which takes advantage of parasitic capacitance associated with the wells of the integrated resistor networks. Selection of N-depletion capacitors which have a moderate-to-low voltage coefficient at the desired bias point of the amplifier can aid in maintaining the frequency stability of the overall crystal oscillator system.

Accordingly, the principal object of the present invention is to provide a general, practical, and predetermined circuit to allow the bias point of an inverting oscillator amplifier to be regulated both by the amplitude of the oscillator amplifier as well as a non-linear relationship between the amplifier input and output interface voltages.

BRIEF DESCRIPTION OF THE DRAWINGS

For a more complete understanding of the present invention and the objects and advantages thereof, reference may be made to the following descriptions taken in conjunction with the accompanying drawings in which.

DESCRIPTION OF THE PRESENTLY PREFERRED EXEMPLARY EMBODIMENTS

A presently preferred embodiment of the invention incorporates all required circuitry on a single silicon substrate with the exception of the crystal resonator.

Figure 2:
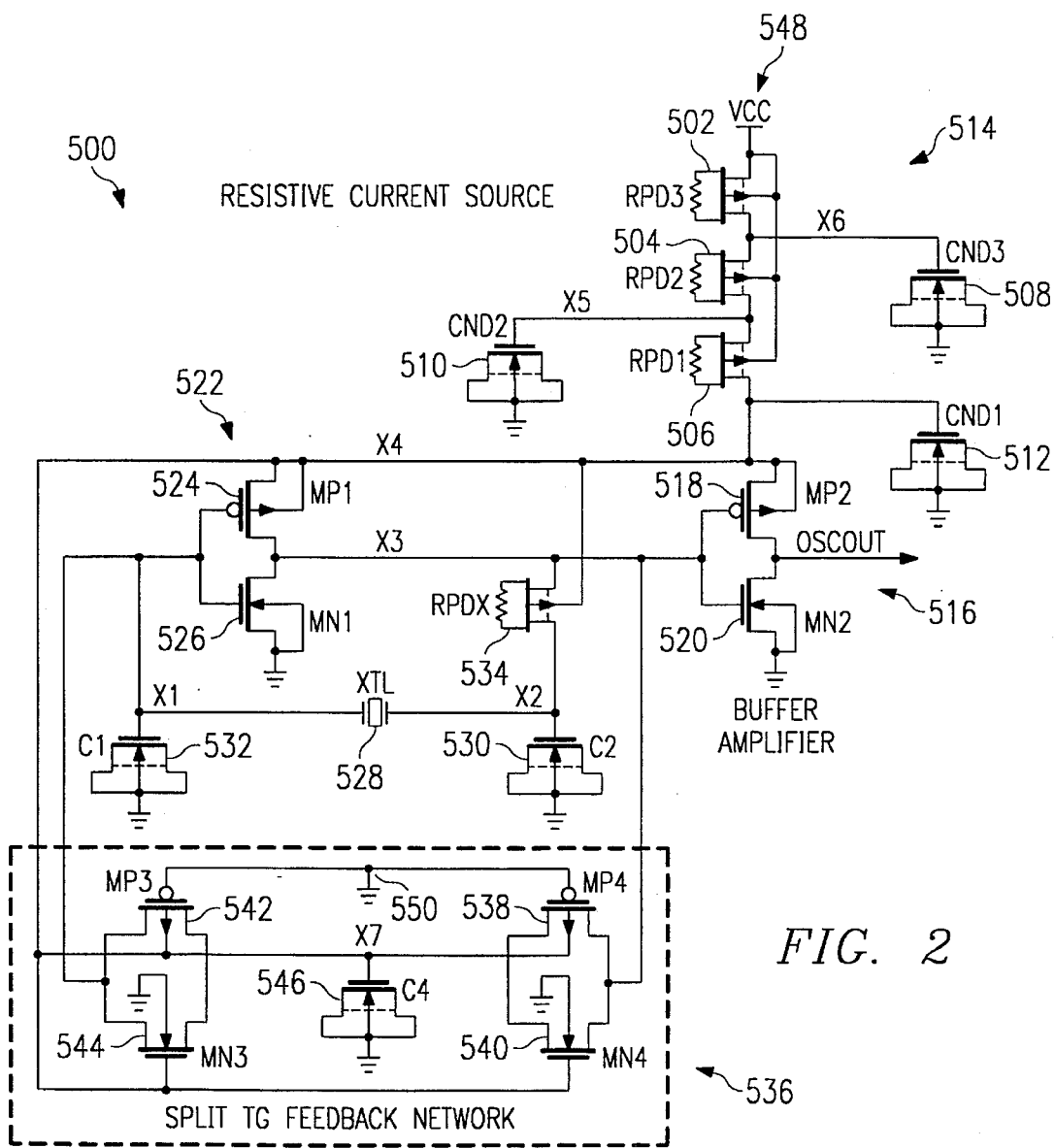
FIG. 2 is a circuit diagram of a preferred embodiment of the present invention with a resistive current source used to implement the power source for the oscillator amplifiers.

Referring to FIG. 2, a preferred embodiment of the of a crystal oscillator bias stabilizer device 500 of present invention is shown.

Stabilizer device 500 includes a resistive current source 514, two MOS device amplifiers 516 and 522, a crystal oscillator 528, N-depletion load capacitors 530 and 532, a split transmission gate feedback network 536, a feedback limiting resistor 534, power connector 548 and a ground connector 550.

Resistive current source 514 includes a series of three P-depletion MOSFET well resistors 502, 504 and 506, and three N-depletion MOSFET capacitors 508, 510 and 512. Resistors 502, 504 and 506, in conjunction with capacitors 508, 510 and 512 generate a semi-ideal current source when a fixed supply voltage is used.

MOS device amplifier 516 includes a P-channel MOS device 518 and an N-channel MOS device 520. Likewise, MOS device amplifier 522 includes a P-channel MOS device 524 and an N-channel MOS device 526.

Split transmission gate feedback network 536 includes P-channel MOS devices 538 and 542, N-channel MOS devices 540 and 544, and a N-depletion capacitor 546.

Figure 9:
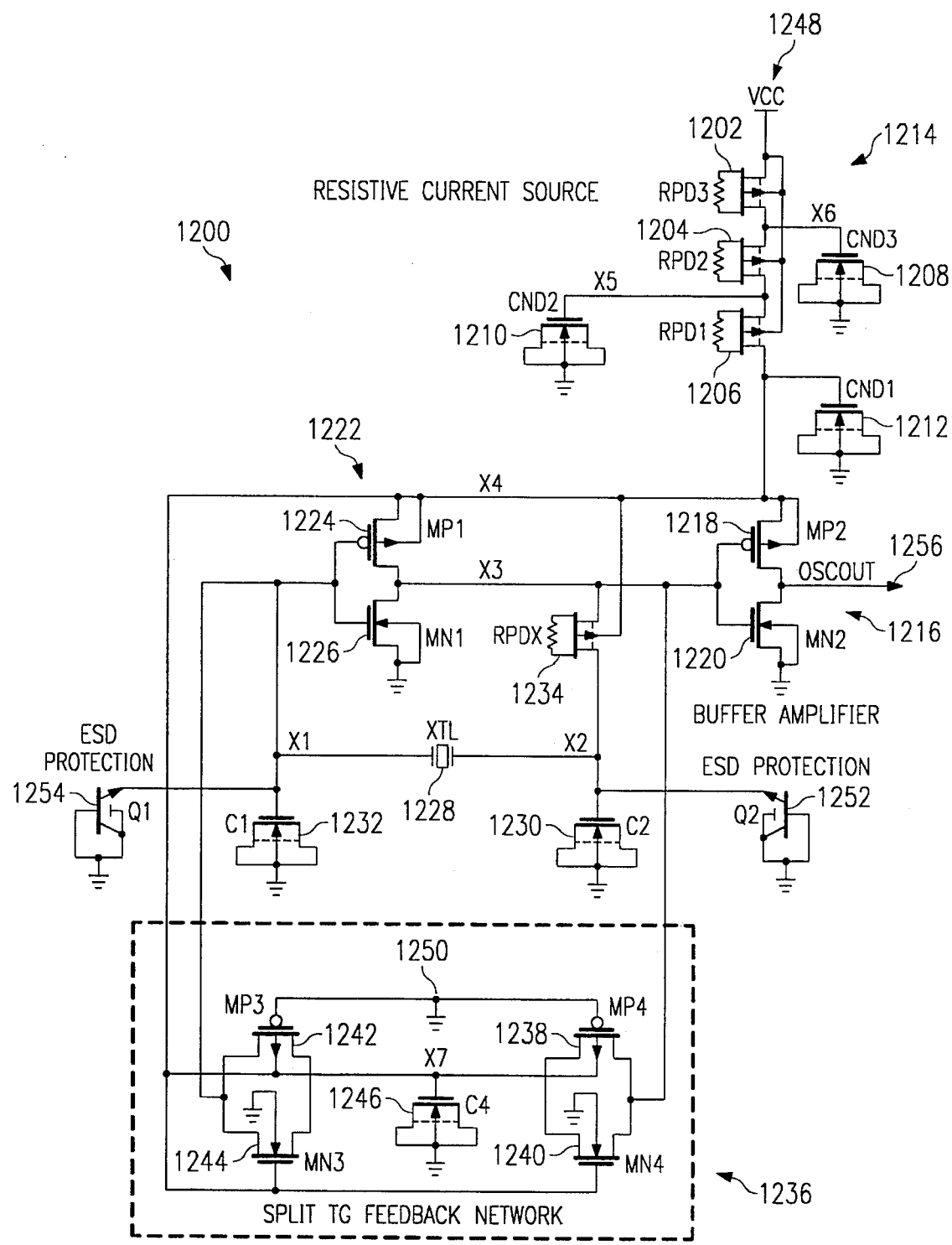
FIG. 9 is a circuit diagram of another preferred embodiment of the present invention with the incorporation of electrostatic discharge (ESD) devices in the form of integrated and reverse-biased NPN transistors.
Figure 10:
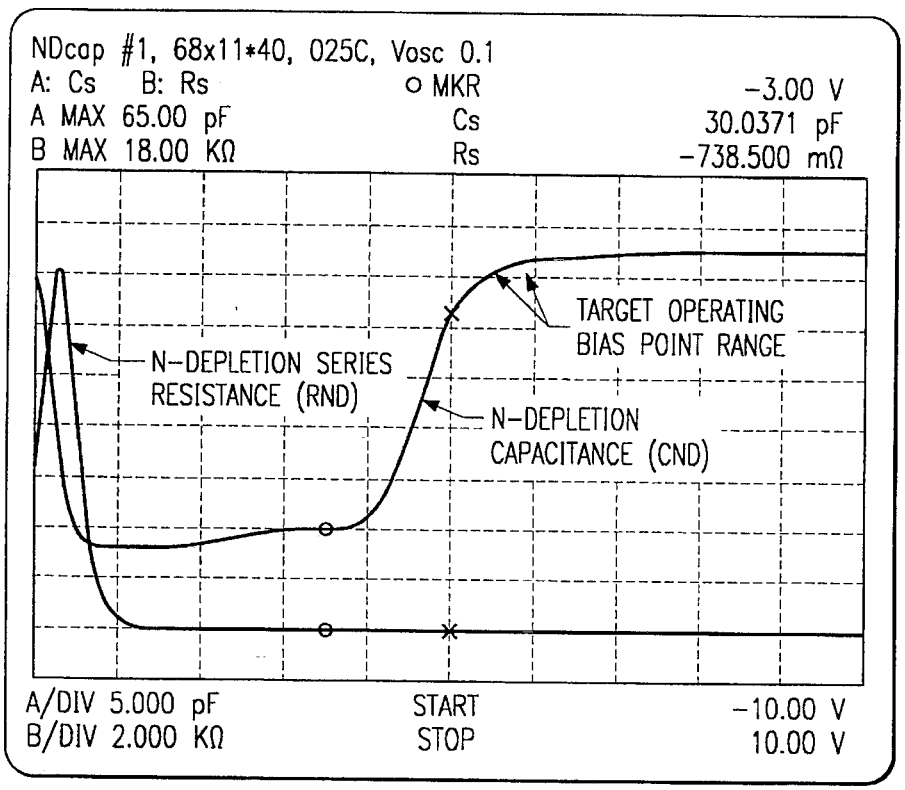
FIG. 10 is a graph illustrating the capacitance of the N-depletion capacitors used in the implementation of a practical crystal oscillator.
Figure 11:
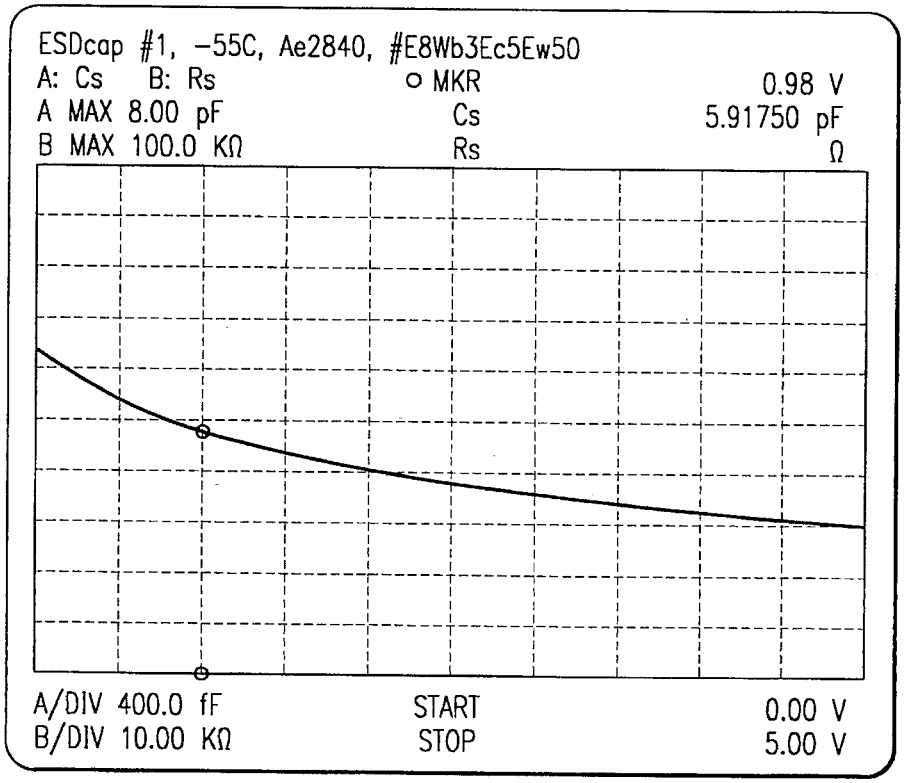
FIG. 11 is a graph illustrating the capacitance of the NPN ESD protection structures as similarly shown in FIG. 9 operating at −55° C.
Figure 12:
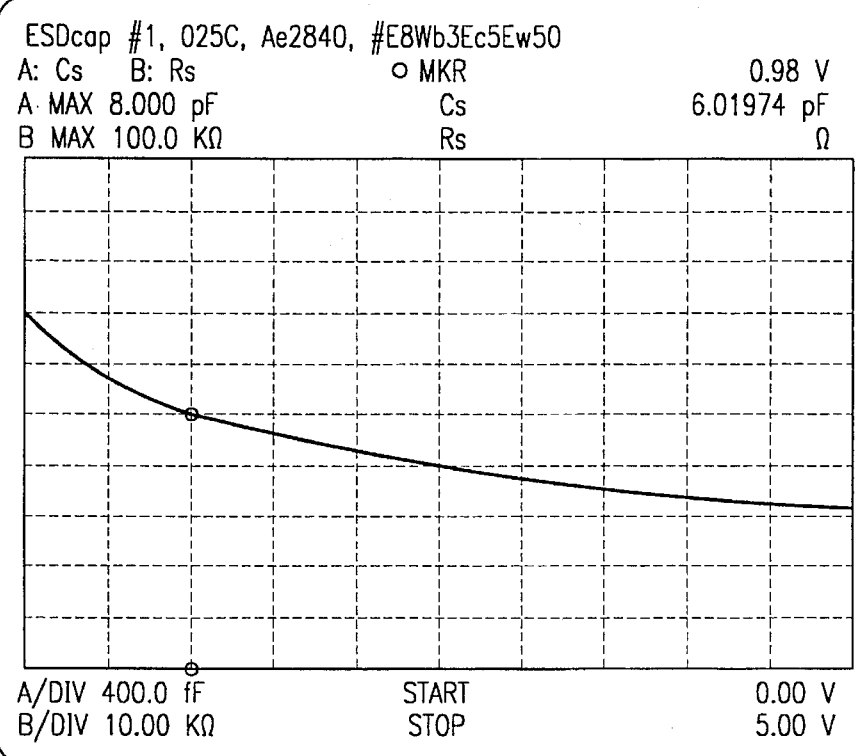
FIG. 12 is a graph illustrating the capacitance of the NPN ESD protection structures as similarly shown in FIG. 9 operating at +25° C.
Figure 13:
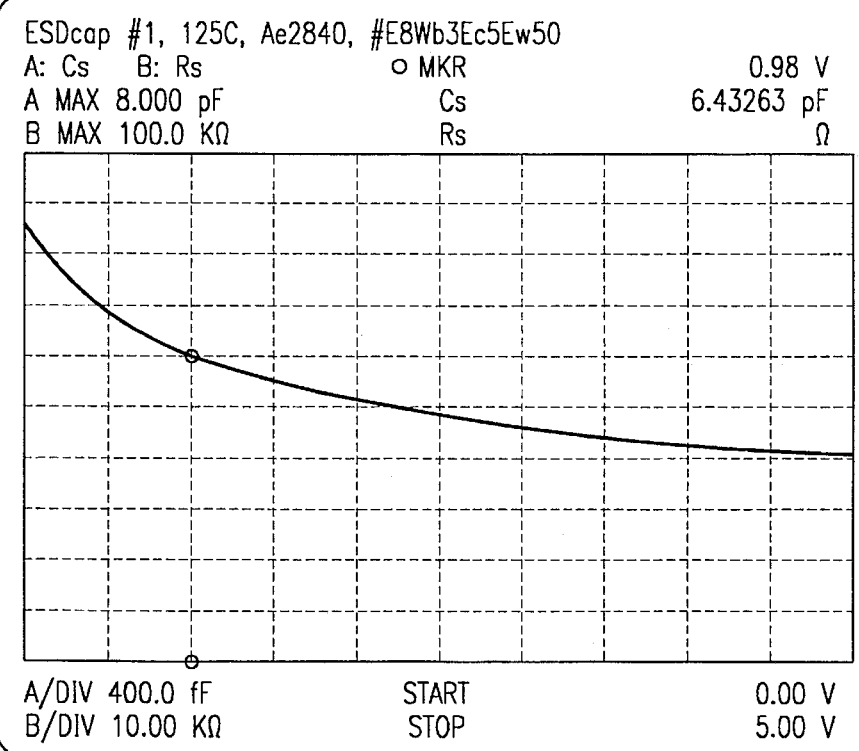
FIG. 13 is a graph illustrating the capacitance of the NPN ESD protection structures as similarly shown in FIG. 9 operating at +125° C.

Referring now to FIG. 9, an alternative preferred embodiment of the of a crystal oscillator bias stabilizer device 1200 of present invention is shown.

Stabilizer device 1200 includes a resistive current source 1214, two MOS device amplifiers 1216 and 1222, a crystal oscillator 1228, N-depletion load capacitors 1230 and 1232, a split transmission gate feedback network 1236, a feedback limiting resistor 1234, a power connector 1248, a ground connector 1250, and electrostatic discharge (ESD) protection devices 1252 and 1254.

Resistive current source 1214 includes a series of three P-depletion MOSFET well resistors 1202, 1204 and 1206, and three N-depletion MOSFET capacitors 1208, 1210 and 1212. Resistors 1202, 1204 and 1206, in conjunction with capacitors 1208, 1210 and 1212 generate a semi-ideal current source with a fixed supply voltage.

MOS device amplifier 1216 includes a P-channel MOS device 1218 and an N-channel MOS device 1220. Likewise, MOS device amplifier 1222 includes a P-channel MOS device 1224 and an N-channel MOS device 1226.

Split transmission gate feedback network 1236 includes P-channel MOS devices 1238 and 1242, N-channel MOS devices 1240 and 1244, and a N-depletion MOSFET capacitor 1246.

The topologies of the two embodiments circuits illustrated in FIGS. 2 and 9 are identical with the exception of ESD protection devices 1252 and 1254 which have been added to the circuit in FIG. 9.

Crystal Resonator and Load Capacitors

Referring now to FIG. 9, the preferred embodiment depicted therein uses a parallel resonant crystal requiring an inverting amplifier configuration as is targeted by the disclosed invention.

The load capacitance required by the crystal resonator 1228 is generated by a combination of N-depletion capacitors 1230 and 1232 as well as ESD protection devices 1252 and 1254. The sum of the capacitances of capacitor 1232 and ESD device 1244, and capacitor 1230 and ESD device 1252, will be approximately twice the required load capacitance for crystal resonator 1228.

Although many types of crystal resonators may be used to construct a suitably stable clock source, the crystal of choice in the preferred embodiment is the miniature watch crystal that is widely available commercially, such as the EPSON models C-001R, C002RX, C-004R, or C-005R.

Many such miniature crystals are suitable for use in a low powered crystal oscillator. Such watch crystals are packaged in small hermetically-sealed containers and have nominal loaded frequencies of 32768 Hz, and load capacitance values of typically 6 pF or 12 pF when used in parallel resonant oscillator configurations.

Feedback Limiting Resistor

The Crystal Resonator 1228 has as one of its limitations a maximum power dissipation rating that must not be exceeded in the course of normal oscillator operation.

For the watch crystals used in the present embodiment, crystal resonator 1228 has a nominal limit of 1 uW power dissipation.

To meet this specification, P-depletion MOSFET well resistor 1234 is fabricated with a resistance on the order of 50 k ohms to limit the current and thus the power dissipation through crystal resonator 1228.

It is understood that the exact value of this resistor will be determined from the desired operating point of the oscillator amplifier as well as the manufacturer's specifications of the exact crystal to be used in the oscillator.

Oscillator Amplifier and Oscillator Buffer

Referring still to FIG. 9, the inverting CMOS amplifier 1222 is formed by the combination of MOS enhancement mode transistors 1224 and 1226 which are operated in what is termed "weak inversion" operation by limiting the supply voltage at node X4 via the resistive current source 1214 formed by the combination of resistors 1202, 1204 and 1206 with capacitors 1208, 1210 and 1212.

The weak inversion operation of MOS transistors is characterized by a high transconductance-to-drain current ratio of the MOS device, an exponential relationship between applied gate-source voltage and resulting drain current, and, simultaneously, a severe reduction in the high frequency response of the device.

The weak inversion limit on supply voltage at node X4 is based on the process technology used in the formulation of an integrated circuit incorporating the teachings of the present invention. It is required that the voltage at node X4 be limited to the sum of the threshold voltages of P-channel MOS device 1224 and N-channel device 1226.

For typical process parameters, these thresholds voltages are 0.8 V and 0.9 V respectively for N-channel and P-channel MOS devices. Thus, any voltage at node X4 less than 1.7 V will guarantee weak inversion operation of amplifier 1222 and thus produce low power oscillator operation.

Proper sizing of amplifier 1222 is critical for both low power circuit operation and high yield across process variations. In the presently preferred embodiment P-channel MOS device 1224 is sized at $28/5$ microns and N-channel MOS device 1226 is sized at ⅖ microns, with both devices having a stepped replication factor of two.

It is important to note that nominal device strength factors can not be utilized in sizing amplifier 1222 because the device strengths as published by most integrated circuit foundries do not accurately reflect the MOS transistor operation in the weak inversion regime. Conventional wisdom with respect to device sizing is not suitable for the sizing of this inverting amplifier.

Figure 14:
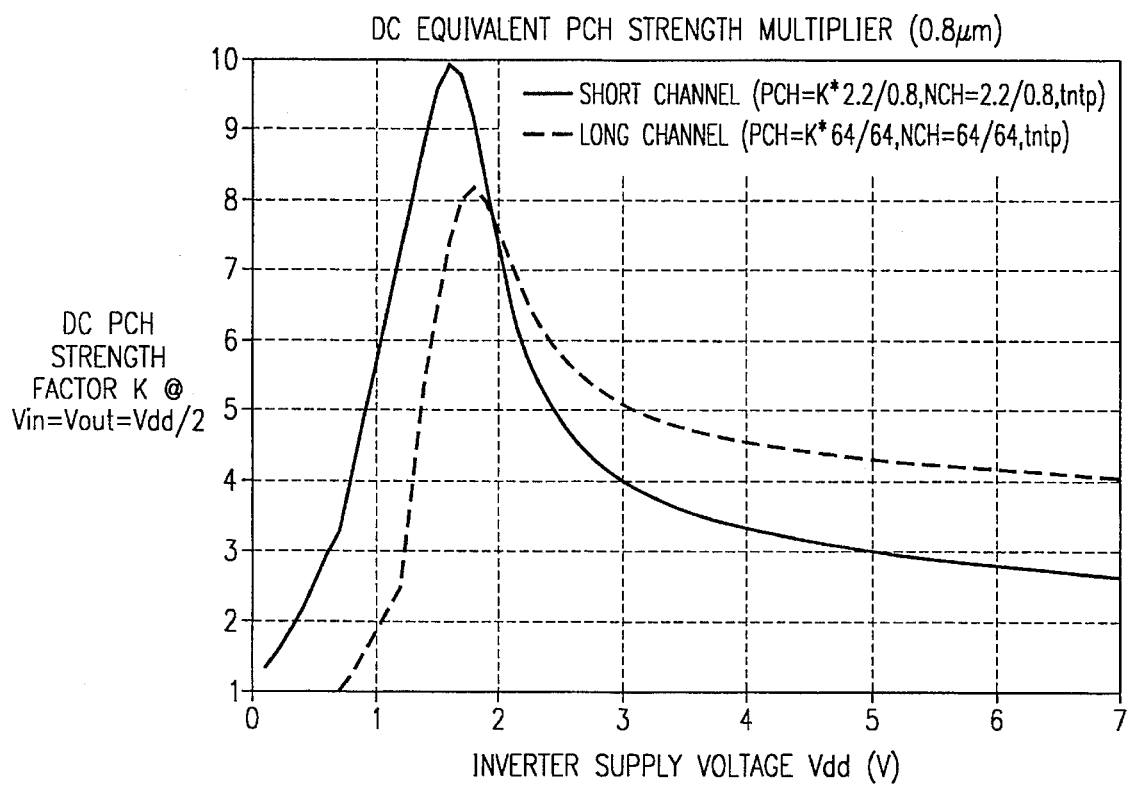
FIG. 14 is a graph illustrating a strength comparison between P-channel enhancement devices and their corresponding N-channel enhancement counterparts.

As illustrated in the graph FIG. 14, the strength ratio for a P-channel MOS device to a comparable N-channel MOS device when operating in weak inversion ranges from 3–10, depending on the bias point selected.

As can be seen from the graph of FIG. 14, the strength ratio of P-channel device width to corresponding N-channel device width varies based on the desired bias point of the devices as well as the channel length of the device.

What is significant from a design standpoint is that when operating in the weak inversion regime with Vdd<1.5 V, the strength ratio becomes highly dependent on the inverter supply voltage, or bias point of the system. Typical strength ratios of 3–10 are indicated by the graph, indicating that the P-channel devices are ⅓ to 1/10 as strong as their equivalently sized N-channel counterparts when operating in this regime of device operation. This is in stark contrast to operation at Vdd=5 V, in which the strength ratio is on the order of 3.0–4.5 and relatively constant.

Therefore, to obtain equivalent strengths and maintain a mid-supply bias point, it is required that the P-channel size of P-channel MOS device 1224 be some multiple of the N-channel depending on the desired operating point of oscillator amplifier 1222. Note also from the FIG. 14 graph that short channel devices are not preferred when constructing the oscillator amplifier, as they are much more susceptible to gain variations caused by bias point shifts.

Referring again to FIG. 9, the oscillator buffer 1216 is nominally sized at 4.4/0.8 microns for P-channel MOS device 1218 and 2.2/0.8 microns for N-channel MOS device 1220, with the thresholds for buffer amplifier 1216 purposely skewed to minimize loading effects of amplifier 1216 on the supply voltage at node X4, which services both oscillator amplifier 1222 and buffer amplifier 1216.

Note that the OSCOUT node is a buffered inversion of node X3, which represents the in-phase output of oscillator amplifier 1222.

It is contemplated to be within the scope of the present invention that buffer amplifier 1216 could also be placed such that its input is connected to node X1, thus producing an inversion of the in-phase input to the oscillator amplifier 1222. The advantage of this secondary connection scheme allows a lower input impedance to be seen by the crystal resonator 1228 at node X1.

It is understood that the precise device sizes for oscillator amplifier 1222 and buffer amplifier 1216 are process dependent and will vary significantly with the actual implementation of the disclosed invention.

The significant aspect of the disclosed invention is the importance of selecting the size ratios of the P-channel and N-channel MOS devices to account for the highly non-linear behavior of MOS devices when operating in the weak inversion regime.

Split Transmission Gate Feedback Network

Referring still to FIG. 9, a key aspect of the presently preferred embodiment depicted therein is the use of split transmission gate feedback network 1236, which includes P-channel MOS devices 1238 and 1242, N-channel MOS devices 1240 and 1244 and N-depletion MOSFET capacitor 1246 to provide low frequency dynamic non-linear negative feedback to oscillator amplifier 1222.

This topology is significantly different from that used in current technologies in that this split transmission gate topology is designed to guarantee weak inversion operation of all elements of both amplifier 1222 and buffer 1216.

Figure 4:
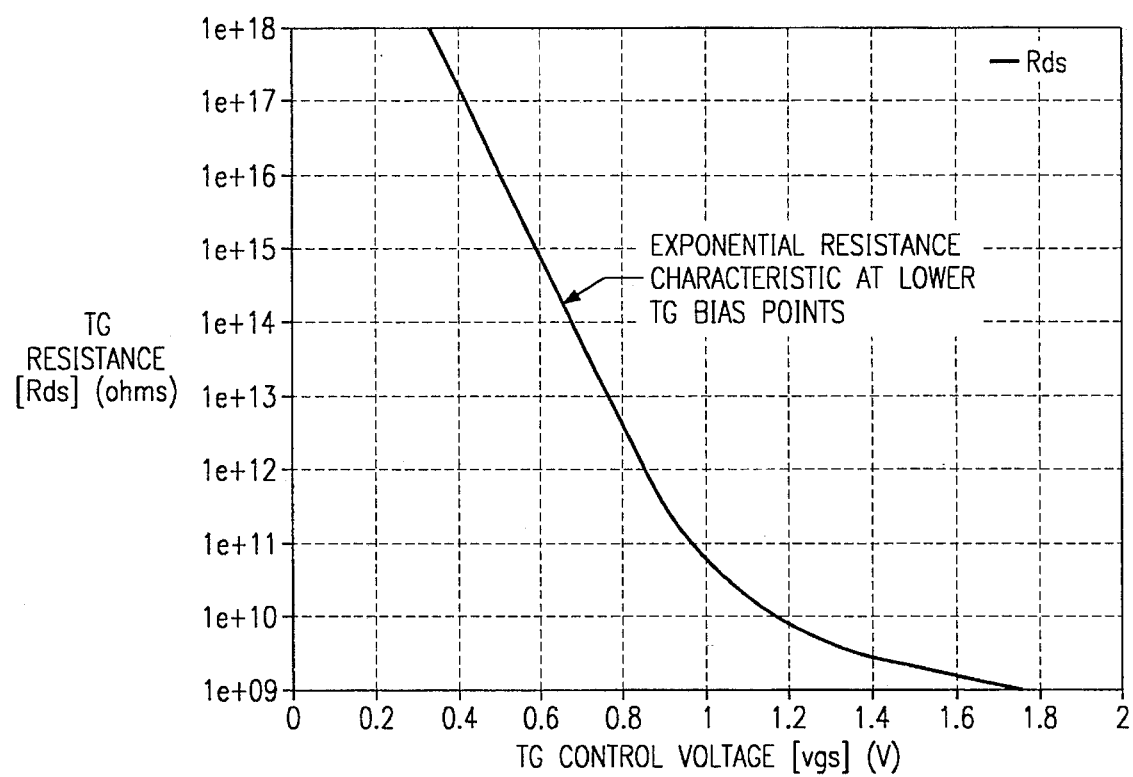
FIG. 4 is a graph illustrating a logarithmic output resistance of the gate of an N-channel MOSFET transmission characteristic swept over a control voltage of [0 V, 2.0 V]

A significant feature of this weak inversion operation is the fact that the impedance seen across the split TG nodes X1 and X2 is exponentially non-linear as illustrated in FIG. 4.

In particular FIG. 4 illustrates a typical N-channel MOSFET transmission gate logarithmic output resistance characteristic swept over a control voltage of [0 V, 2.0 V].

Figure 3:
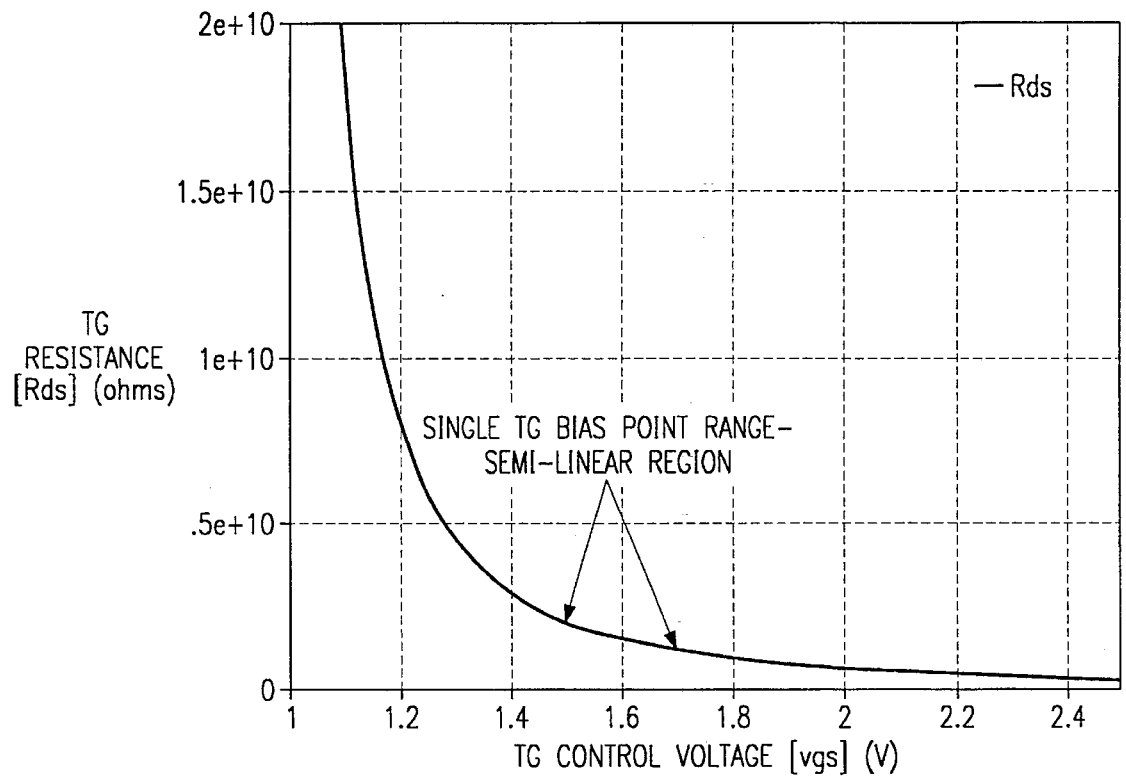
FIG. 3 is a graph illustrating a linear output resistance of the gate of an N-channel MOSFET transmission characteristic swept over a control voltage of [1 V, 2.5 V]

This plot presents the data of FIG. 3 with a different control voltage range and output resistance scaling. This logarithmic plot of output resistance (Rds) vs. gate-source voltage (vgs) indicates that, to a first order approximation, the resistance seen across a single transmission gate is approximately exponential when the control voltage is less than 1 V, a typical bias point for the crystal oscillator configuration of the present invention.

In this circumstance the performance of TG feedback circuit 1236 will be substantially different from that seen in current oscillators, because the resistance values present across the transmission gate elements will vary exponentially with applied control voltage, a characteristic not found in any of the current oscillators.

If the bias point at node X5 of the present invention is maintained at approximately 1.5 V–2.0 V, the per-TG voltage drop in the split-TG configuration will be 0.75 V–1.0 V, placing the resistance of each TG clearly in the regime of the exponential resistance characteristic of FIG. 4.

This non-linear feedback increases the effective resistance dramatically as the difference in the voltages at nodes X1 and X2 decreases, thus increasing the closed loop gain of oscillator amplifier 1222.

As the difference in the voltages at nodes X1 and X2 increases, the effective resistance of split TG 1236 decreases exponentially, thus reducing the closed loop gain of oscillator amplifier 1222.

This non-linear feedback relationship provides a form of amplitude stabilization for oscillator amplifier 1222, providing maximum gain in circumstances where the oscillator signal is minimum and the bias point at nodes X1 and X2 have been stabilized, while at the same time providing maximum negative feedback and minimum gain when the oscillator signal across nodes X1 and X2 is large.

The addition of N-depletion capacitor 1246 at the center of split TG 1236 serves to make node X7 a virtual ground in the feedback network from an AC perspective. The addition of this component in addition to the weak inversion operation of split TG 1236 significantly reduces negative feedback at frequencies above DC.

Good results have been realized when values for capacitor 1246 are on the order of several picofarads thereby being sufficient to reduce the AC feedback an additional 40 dB over that of a single transmission gate feedback network operating in the MOS linear region.

Figure 5:
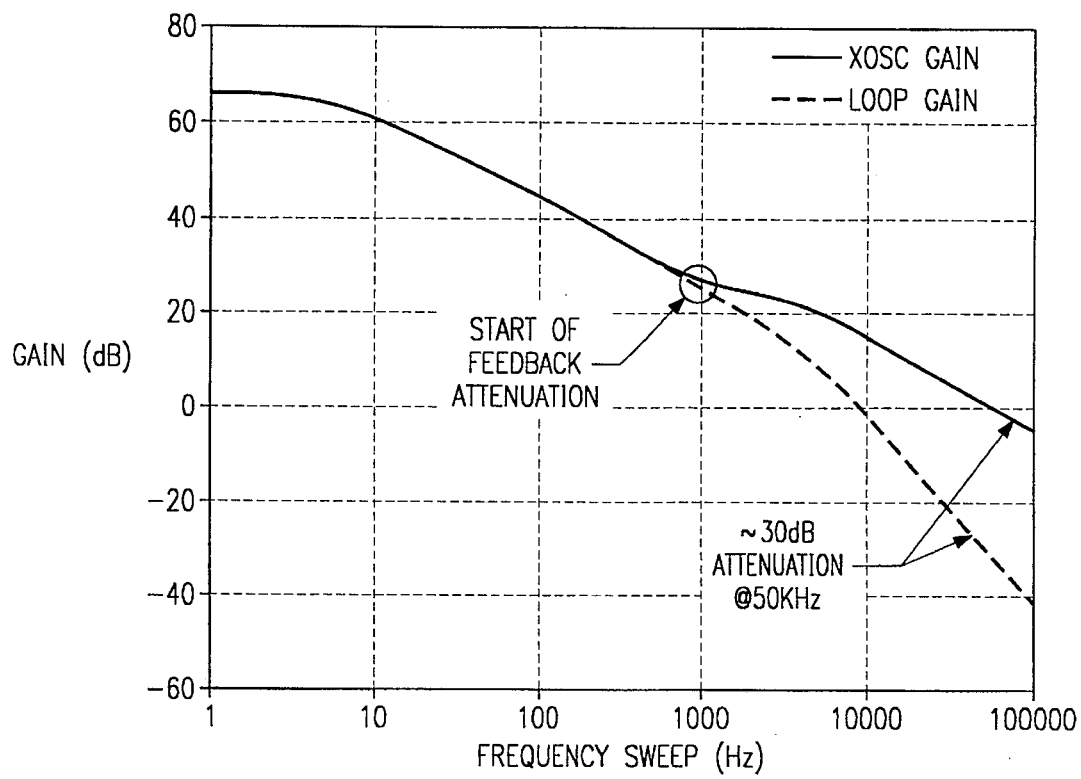
FIG. 5 is a graph illustrating the open-loop and closed-loop frequency response of a typical crystal oscillator such as shown in FIG. 1.
Figure 6:
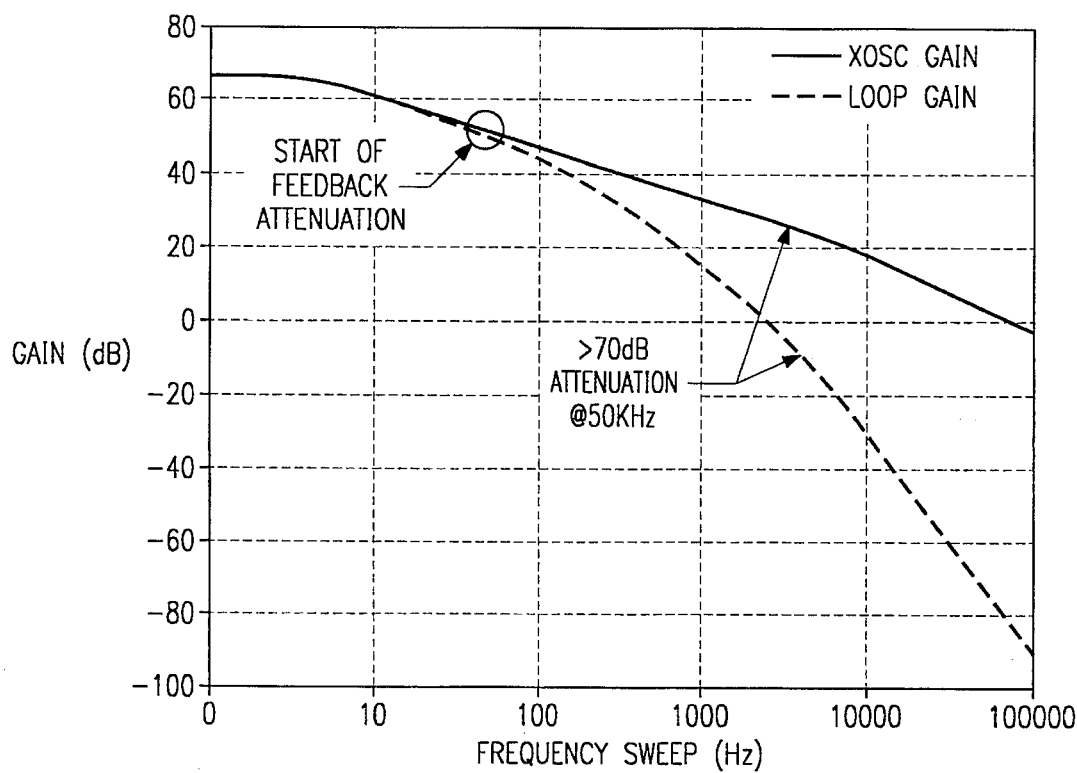
FIG. 6 is a graph illustrating the open-loop and closed-loop frequency response of the circuit of FIG. 2.

As can be seen in comparing FIG. 5 and 6, the combination of using split TG network 1236 with a capacitor versus a conventional single TG feedback network is quite dramatic.

Figure 1:
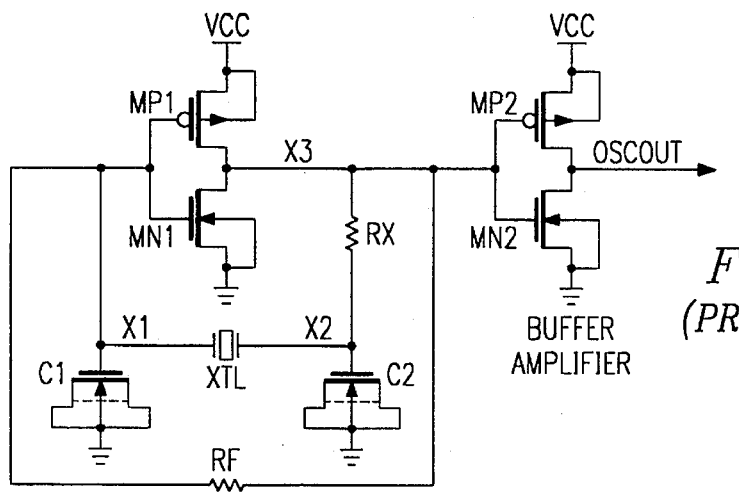
FIG. 1 is a circuit diagram illustrating a conventional CMOS crystal oscillator having a fixed resistive feedback resistor to provide DC bias stabilization for the inverting amplifier.

In particular, FIG. 5 illustrates an open-loop and closed-loop frequency response of typical current circuits, such as shown in FIG. 1, but with a single TG feedback configuration.

FIG. 5 indicates that the circuit has a unity gain frequency of approximately 60 kHz, and that the loop gain through the single TG configuration is approximately 30 dB down from the overall forward amplifier gain.

While this is acceptable performance at the target operating frequency of 32768 Kz, it is also noted that the loop gain and feedback gain are approximately identical to 1 kHz. This indicates that this design suffers from significant noise immunity problems from DC to 1 kHz. This characteristic makes this circuit particularly susceptible to induced noise in the common 50–60 Hz power line frequency.

FIG. 6 illustrates the open-loop and close-loop frequency response of the present invention. It is significant to note that this graph illustrates an improvement in open loop gain over that seen in FIG. 5 at the target crystal frequency of 32768 Hz.

In addition, it is significant to note that at the target crystal frequency of 32768 Hz, the loop gain has dropped to −40 dB below that observed in FIG. 5. Also of significant importance is the frequency at which the open-loop and closed-loop gains diverge. This frequency has dropped from approximately 1 kHz in a single TG configuration to approximately 30 Hz in the split-TG configuration of the present invention.

This drop in the start of the feedback loop attenuation results in significant attenuation of AC noise at or near 50–60 Hz, a major contributor to frequency drift in conventional crystal oscillator topologies which are exposed to noisy electrical environments.

Additionally, it may be noted while comparing the split TG performance of FIG. 6 versus the single TG performance of FIG. 5 that the split TG configuration introduces an additional non-linearity in the feedback loop which is not present in the typical oscillators and which significantly reduces the negative feedback at even nominal frequencies of 50–60 Hz.

This enhanced negative feedback control also results in a slight, but measurable improvement in oscillator gain for the oscillator amplifier 1222 as evidenced in the XOSC gain traces of FIGS. 5 and 6.

Resistive Current Source

Referring to FIG. 9, the resistive current source is implemented via the use of P-depletion well resistors that have substantial well-substrate capacitance. This capacitance is augmented at various taps in the resistive chain to provide operating current for a variety of digital logic that is clocked by the output signal 1256 of crystal oscillator 1228.

N-depletion capacitors are used in the preferred embodiment to both filter and stabilize the bias voltages along the resistive current source.

The required negative feedback network for oscillator amplifier 1224 is formed via a split transmission gate topology in which the transmission gate control voltage is derived from the dynamic bias point of amplifier 1224.

This scheme provides significant negative feedback at DC while limiting the negative feedback at the target crystal oscillator frequency.

To supply the required bias current to oscillator amplifier 1222 and buffer amplifier 1216, a series of resistive P-deple-tion MOSFET well resistors 1202, 1204 and 1206 are utilized in conjunction with N-depletion MOSFET capacitors 1208, 1210 and 1212 to generate a semi-ideal current source when a fixed supply voltage VCC 1248 is used.

The total resistance present in resistive filter 1214 is on the order of 5–20 megohms, yielding a drive current on the order of 100–300 nA given a VCC supply voltage of 3 V–5 V. The voltages at nodes X4, X5 and X6, which are filtered by resistive string 1224, can be used as intermediate voltages for additional logic and level translation in circuitry clocked by the OSCOUT node.

It is understood that there are a variety of means for generating these intermediate voltages given this resistive filter structure.

The device 1200 utilizes the inherent capacitance associated with resistors 1202, 1204 and 1206 in conjunction with the additional capacitors 1208, 1210 and 1212 to ensure that current spikes occurring at the node X4 do not significantly impact the voltage at this node. This is an important requirement of the embodiment implementation, as any variations in the voltage at node X4 will be directly reflected in variations in the crystal oscillator frequency as evidenced by the spectrum illustrated in FIG. 7.

Figure 7:
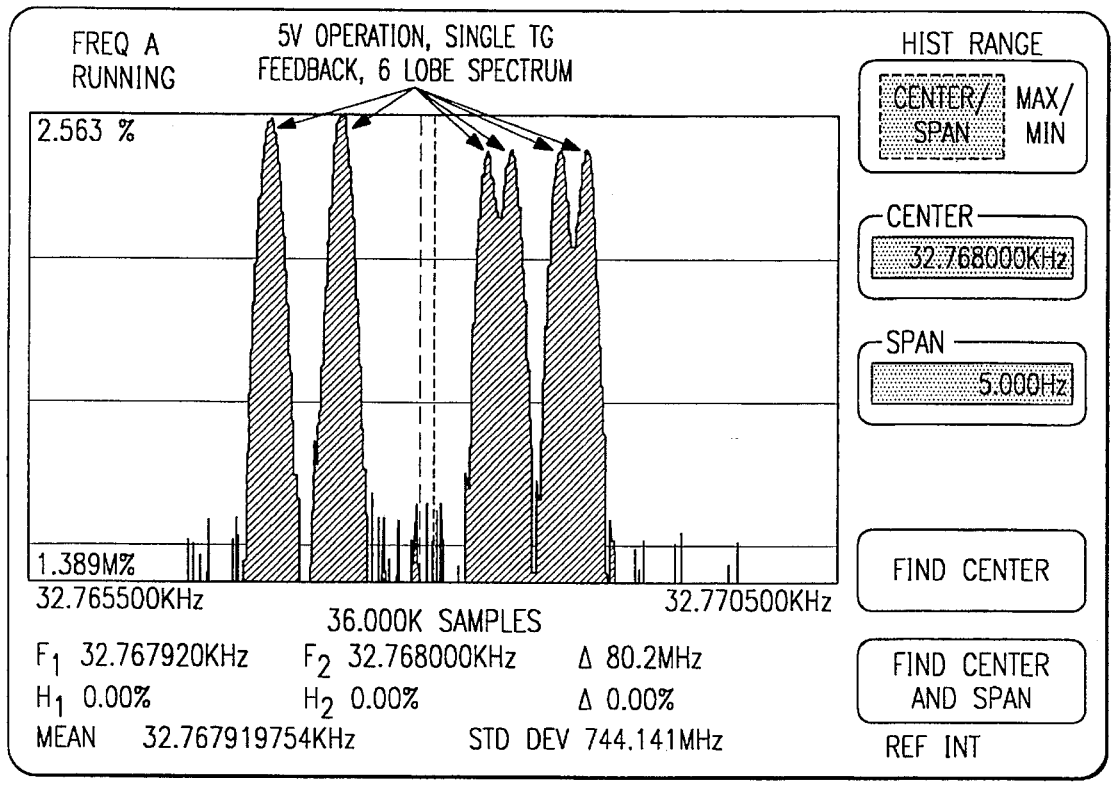
FIG. 7 is a graph illustrating the frequency spectrum of a typical crystal oscillator such as that shown in FIG. 1.

In particular FIG. 7 illustrates the frequency spectrum of a typical crystal oscillator. Note that there are a minimum of six discernible frequency lobes in this illustration, none of which occur at the exact crystal oscillator target frequency of 32768 Hz.

The mean frequency value is an acceptable 32767.92 Hz, but the standard deviation in oscillation frequency is quite large at 744 mHz. This makes this conventional topology unsuitable for many applications which need an accurate and stable source of 32768 Hz clocks.

Figure 8:
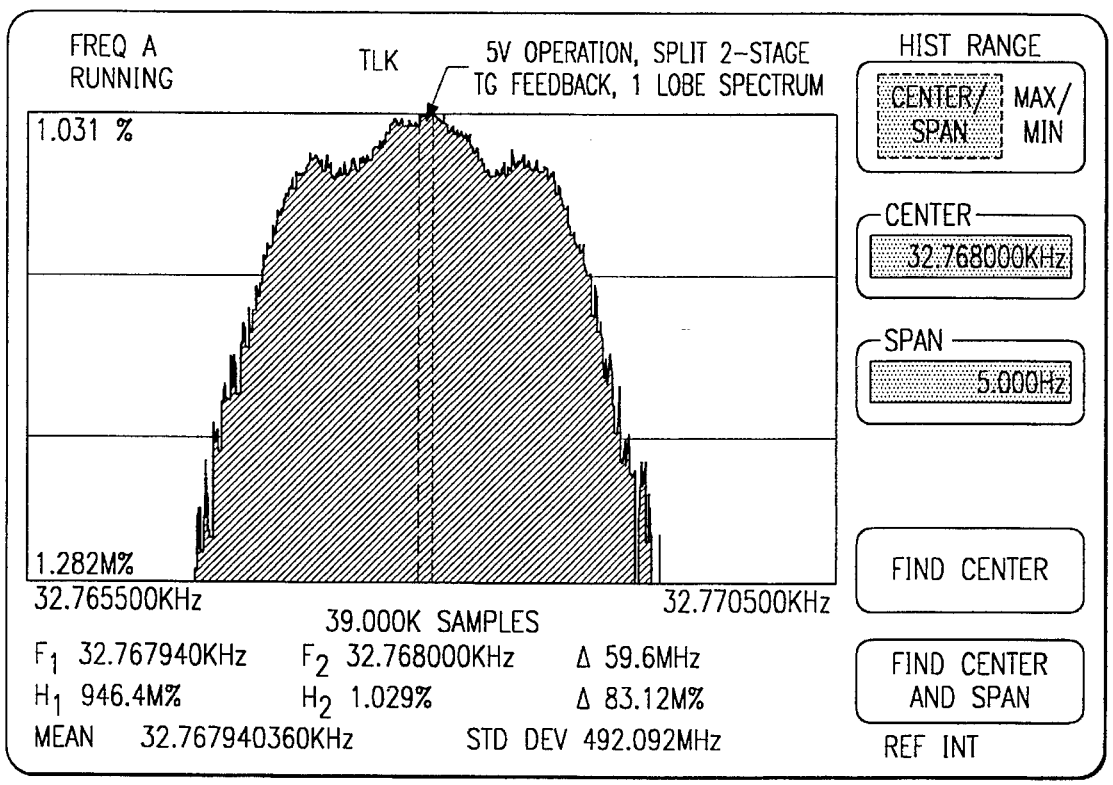
FIG. 8 is a graph illustrating the frequency spectrum of the crystal oscillator of the circuit shown in FIG. 2 of the present invention.

Stabilization of the voltage at node X4, however, when performed in conjunction with split TG feedback network 1230, stabilizes the bias point of amplifier 1222 to produce the purer spectrum as seen in FIG. 8.

In particular, FIG. 8 illustrates the frequency spectrum of the crystal oscillator of the present invention. Note that the six frequency lobes illustrated in FIG. 8 have been collapsed into a single frequency lobe of much narrower spectral width.

As was the case in FIG. 7, the mean frequency value in FIG. 8 is still an acceptable 32767.94 Hz, but the standard deviation in oscillation frequency has changed from 744 mHz to 492 mHz, a reduction of 34%. This clearly illustrates the improvement in both spectral purity and frequency stability that can be achieved with the present invention.

It is contemplated to be within the scope of this invention that while only three filter taps are utilized in resistor 1202, 1204 and 1206 structures, any number of taps are possible. In addition, while the preferred embodiment utilizes P-depletion well resistors and N-depletion capacitors, any suitable technology may be used to implement the resistive filter structure.

ESD Protection Devices

Referring to FIG. 9, the preferred embodiment utilizes ESD protection devices 1252 and 1254 which are reverse-biased P-N junctions found in vertical NPN transistors fabricated on-chip for electrostatic discharge protection.

The addition of these devices has a profound impact on the capacitance as seen by nodes X1 and X2, as the junction capacitance of devices 1252 and 1254 is a non-linear function of both bias voltage and temperature.

In the present embodiment, nodes X4, X5, and X6 serve to supply additional digital countdown circuitry with their operational power requirements.

Since nodes X1 and X2 will be used externally to attach crystal resonator 1228, in many implementations it will be desirable to incorporate ESD protection devices 1252 and 1254 on both the X1 and X2 input pads. However, in some circumstances it may be necessary to forego the use of ESD protection based on other circuit design considerations.

OPERATION OF THE PRESENT INVENTION

An example an electronic system utilizing the present invention is illustrated in the context of a real time clock oscillator module utilizing a lithium 3 V battery as the backup power source, and a nominal 5 V power supply when not operating in battery-backup mode (not shown). The general features of this context will now be described.

Referring to FIG. 9, VCC power 1248 is obtained from a 3 V lithium battery (not shown) when the system is not supplied from an external 5 V power source (not shown).

Within the system context, crystal oscillator amplifier 1222 and a buffer amplifier 1216 serve to generate and shape signals fixed by crystal resonator 1228 and load capacitors 1230 and 1232.

The output signal 1256 of buffer amplifier 1216 is then used to clock digital logic using conventional countdown flip-flops (not shown). The result of this process is a frequency division of the loaded crystal oscillation frequency, which is typically 32768 Hz when using conventional quartz watch crystals.

Once the output signal 1256 has been sufficiently divided by the countdown flip-flops, additional logic within the context of the real time clock function generate appropriate counts for seconds, minutes, hours and associated date information.

In many cases, output signal 1256 is used to perform additional functions outside the realm of simple date and time calculations. Increasingly in the context of portable equipment, output signal 1256 may be used as a clock for a microprocessor or some other intelligent controller or frequency synthesizer.

For this reason, the poor spectral purity caused by the fluctuations of the bias point at nodes X3 and X4 of a typical crystal oscillator (see FIG. 1) have become a significant problem.

Minor changes in the voltage at either node X3 or node X4 tend to cause perturbations in the frequency of the crystal oscillator as seen at the output signal OSCOUT. On average, these fluctuations average out after several stages of flip-flops in the real time clock countdown chain.

Current technologies were not concerned with the spectral purity of the output signal, but rather were concerned with the average accuracy of the seconds, minutes, and hours in the resulting countdown time registers. As new applications have been discovered for the low power output signal, greater concerns have been expressed about the frequency stability of this signal.

To stabilize the bias point of the oscillator amplifier 1222 and thus improve the spectral purity of the output signal 1256, a new approach to the current source supply was implemented in the disclosed invention, incorporating a filter network of P-depletion well resistors (1202, 1204 and 1206) in conjunction with additional N-depletion MOSFET capacitors (1208, 1210 and 1212).

This combination serves to stabilize the voltage at node X4, fixing the bias point of the oscillator inverter power source. In addition, an unconventional split transmission gate feedback network 1230 operating in the weak inversion region of MOSFET devices was constructed using P-channel MOS devices 1238 and 1242, N-channel MOS devices 1240 and 1244, and an N-depletion MOSFET capacitor 1246.

This network serves to inhibit feedback at the target crystal frequency of 32768 Hz, while permitting low frequency feedback to stabilize the bias point at node X3.

An additional benefit of the split transmission gate topology utilized in the disclosed invention is that input and output leakage associated with nodes X1 and X2 has substantially less impact on the bias point of crystal oscillator 1228 than in conventional topologies exhibited by current technologies.

As an example, a conventional single transmission gate feedback network has experimentally been found to exhibit oscillator shutdown with approximately 3–5 nA leakage at node X1. The disclosed split transmission gate topology raises this number to the range of 17–28 nA under similar operating conditions.

In addition, the split transmission gate allows bipolar leakage currents greater than 150 nA to be injected/extracted from node X2, making node X2 essentially impervious to normal leakage paths associated with poor printed circuit board cleaning techniques.

It should be noted that while improving the spectral purity of the output signal 1256 as well as the leakage sensitivity of the crystal oscillator system, the disclosed invention requires no additional power as compared to current technologies and also results in a significant silicon area savings.

For example, a typical single transmission gate feedback scheme might require a single 1.7/2000 CMOS MOSFET transmission gate, whereas the corresponding sizes for the split transmission gate topology could be on the order of 1.7/300 or smaller as dictated by available process technology parameters.

CONCLUSION

Although a preferred embodiment of the present invention has been illustrated in the accompanying Drawings and described in the foregoing Detailed Description, it will be understood that the invention is not limited to the embodiment disclosed, but is capable of numerous rearrangements, modifications and substitutions without departing from the spirit of the invention as set forth and defined by the following claims.

What is claimed is:

1. A crystal oscillator dynamic bias stabilization scheme, comprising:
   a. at least six N-channel MOSFET capacitors, each including a drain connection, a gate connection, a source connection, and a bulk connection;
   b. at least four N-channel enhancement MOSFETs, each including a drain connection, a gate connection, a source connection, and a bulk connection;
   c. at least four P-channel enhancement MOSFETs, each including a drain connection, a gate connection, a source connection, and a bulk connection;
   d. at least four P-channel MOSFET well resistors, each including a drain connection, a gate connection, a source connection, and a bulk connection; and e. a crystal resonator including first and second connections;

f. wherein a first node is created by connecting said drain connection of said third P-channel enhancement MOSFET, said second connection of said crystal resonator, said gate connections of said first P-channel enhancement MOSFET, said first N-channel enhancement MOSFET and said first N-channel depletion MOSFET capacitor, and said drain connection of said third N-channel enhancement MOSFET;

g. a second node is created by connected said first connection of said crystal resonator, said gate connection of said second N-channel MOSFET capacitor, and said drain connection of said first P-channel MOSFET well resistor;

h. a third node is created by connecting said drain connections of said first N-channel enhancement MOSFET and said first P-channel enhancement MOSFET, said source connections of said fourth P-channel enhancement MOSFET and said fourth N-channel enhancement MOSFET, said gate connections of said second P-channel enhancement MOSFET and said second N-channel enhancement MOSFET, and said source connection of said third P-channel MOSFET well resistor;

i. a fourth node is created by connecting said bulk connections of said third P-channel enhancement MOSFET, said second P-channel enhancement MOSFET, said fourth P-channel MOSFET well resistor, said first P-channel enhancement MOSFET and said fourth P-channel enhancement MOSFET, said gate connections of said third and fourth N-channel enhancement MOSFETs, and said fourth N-channel depletion MOSFET capacitor, said source connection of said first and second P-channel enhancement MOSFETs, and said drain connection of said P-channel MOSFET well resistor;

j. a fifth node is created by connecting said gate connection of said fifth N-channel depletion MOSFET capacitor, said drain connection of said second P-channel MOSFET well resistor, and said source connection of said first P-channel MOSFET well resistor;

k. a sixth node is crated by connecting said drain connection of said third P-channel MOSFET well resistor, said source connection of said second P-channel MOSFET well resistor, and said gate connection of said sixth N-channel depletion MOSFET capacitor;

l. a seventh node is created by connecting said source connections of said third P-channel enhancement MOSFET and said third N-channel enhancement MOSFET, said drain connections of said fourth P-channel enhancement MOSFET and said fourth N-channel enhancement MOSFET, and said gate connection of said fourth N-channel depletion MOSFET capacitor;

m. an eighth node is created by connecting said source connection of said third P-channel MOSFET well resistor, and said bulk connections of said first, second and third P-channel MOSFET well resistors; and n. a ninth node is created by connecting said source connections of said first and second N-channel enhancement MOSFETs, and each of said six N-channel MOSFET capacitors, said bulk connections of each of said six N-channel MOSFET capacitors, and each of said four N-channel enhancement MOSFETs, said drain connections of each of said six N-channel MOSFET capacitors, and said gate connections of said third and fourth P-channel enhancement MOSFETs.

2. A scheme as recited in claim 1, further comprising:

a. first and second electrostatic discharge elements integrated therein.

3. A scheme as recited in claim 2, wherein:

a. each of said first and second electrostatic discharge elements include a reverse-bias NPN transistor with a collector connection, a base connection, an emitter connection, and a bulk connection, b. wherein said emitter connection of said first electrostatic discharge element is connected to said first node;

c. said emitter of said second electrostatic discharge element is connected to said second node;

d. each of said collector, base and bulk connections of said first electrostatic discharge element is connected to said ninth node; and e. each of said collector, base and bulk connections of said electrostatic discharge element is connected to said ninth node.

4. A crystal oscillator dynamic bias stabilization scheme, comprising:

a. at least six N-channel MOSFET capacitors, each including a drain connection, a gate connection, a source connection, and a bulk connection;

b. at least four N-channel enhancement MOSFETs, each including a drain connection, a gate connection, a source connection, and a bulk connection;

c. at least four P-channel enhancement MOSFETs, each including a drain connection, a gate connection, a source connection, and a bulk connection;

d. at least four P-channel MOSFET well resistors, each including a drain connection, a gate connection, a source connection, and a bulk connection; and e. a crystal resonator including first and second connections;

f. wherein a first node is created by connecting said drain connections of said third N-channel enhancement MOSFET and said third P-channel enhancement MOSFET, said second connection of said crystal resonator, said gate connections of said first and second P-channel enhancement MOSFETs, said first and second N-channel enhancement MOSFETs and said first N-channel depletion MOSFET capacitor;

g. a second node is created by connected said first connection of said crystal resonator, said gate connection of said second N-channel MOSFET capacitor, and said drain connection of said first P-channel MOSFET well resistor;

h. a third node is created by connecting said drain connections of said first N-channel enhancement MOSFET and said first P-channel enhancement MOSFET, said source connections of said fourth P-channel enhancement MOSFET and said fourth N-channel enhancement MOSFET, and said source connection of said third P-channel MOSFET well resistor;

i. a fourth node is created by connecting said bulk connections of said third P-channel enhancement MOSFET, said second P-channel enhancement MOSFET, said fourth P-channel MOSFET well resistor, said first P-channel enhancement MOSFET and said fourth P-channel enhancement MOSFET, said gate connections of said third and fourth N-channel enhancement MOSFETs, and said fourth N-channel depletion MOSFET capacitor, said source connection of said first and second P-channel enhancement MOSFETs, and said drain connection of said P-channel MOSFET well resistor;

j. a fifth node is created by connecting said gate connection of said fifth N-channel depletion MOSFET capacitor, said drain connection of said second P-channel MOSFET well resistor, and said source connection of said first P-channel MOSFET well resistor;

k. a sixth node is crated by connecting said drain connection of said third P-channel MOSFET well resistor, said source connection of said second P-channel MOSFET well resistor, and said gate connection of said sixth N-channel depletion MOSFET capacitor;

l. a seventh node is created by connecting said source connections of said third P-channel enhancement MOSFET and said third N-channel enhancement MOSFET, said drain connections of said fourth P-channel enhancement MOSFET and said fourth N-channel enhancement MOSFET, and said gate connection of said fourth N-channel depletion MOSFET capacitor;

m. an eighth node is created by connecting said source connection of said third P-channel MOSFET well resistor, and said bulk connections of said first, second and third P-channel MOSFET well resistors; and n. a ninth node is created by connecting said source connections of said first and second N-channel enhancement MOSFETs, and each of said six N-channel MOSFET capacitors, said bulk connections of each of said six N-channel MOSFET capacitors, and each of said four N-channel enhancement MOSFETs, said drain connections of each of said six N-channel MOSFET capacitors, and said gate connections of said third and fourth P-channel enhancement MOSFETs.

5. A dynamic bias stabilizer device for a low power crystal oscillator, comprising:

a. a means for amplifying for providing the output of the crystal oscillator;

b. means connected in a feedback loop for controlling the gain of said amplifying means; and c. means connected to a power supply for controlling the operating bias point of said amplifying means.

6. A device as recited in claim 5, wherein said amplifying means includes an inverting amplifier.

7. A device as recited in claim 5, wherein said bias point controlling means includes a filtered resistive ladder network.

8. A device as recited in claim 7, wherein said resistive ladder network includes a plurality of integrated capacitors coupled with a plurality integrated resistors.

9. A device as recited in claim 8, wherein said integrated capacitors are N-channel MOSFET capacitors.

10. A device as recited in claim 8, wherein said integrated resistors are P-channel MOSFET well resistors.

11. A device as recited in claim 6, wherein said inverting amplifier includes a first P-channel enhancement MOSFET and a first N-channel enhancement MOSFET.

12. A device as recited in claim 5, wherein said feedback means provides negative feedback at low frequencies and inhibits negative feedback at high frequencies.

13. A device as recited in claim 12, wherein said feedback means includes a split transmission gate feedback network.

14. A device as recited in claim 13, wherein said feedback network includes at least two P-channel enhancement MOSFETs.

15. A device as recited in claim 13, wherein said feedback network includes at least two N-channel enhancement MOSFETs.

16. A device as recited in claim 13, wherein said feedback network includes at least one integrated capacitor.

17. A device as recited in claim 16, wherein said integrated capacitor is an N-channel MOSFET capacitor.

18. A device as recited in claim 5, further comprising means for limiting the power dissipation of the crystal oscillator.

19. A device as recited in claim 18, wherein said power limiting means includes an integrated resistor.

20. A device as recited in claim 19, wherein said integrated resistor is a P-channel MOSFET well resistor.

21. A device as recited in claim 5, further comprising an output buffer amplifier.

22. A device as recited in claim 21, wherein said buffer amplifier includes a first P-channel enhancement MOSFET and a first N-channel enhancement MOSFET.

23. A device as recited in claim 5, further comprising at least one load capacitor connected to the crystal oscillator.

24. A device as recited in claim 5, further comprising at least one electrostatic discharge protection device.

* * * * *